United States Patent [19]

Torii

[11] Patent Number: 5,126,737
[45] Date of Patent: Jun. 30, 1992

[54] METHOD FOR CONVERTING A DIGITAL SIGNAL INTO ANOTHER DIGITAL SIGNAL HAVING A DIFFERENT SAMPLING FREQUENCY

[75] Inventor: Junji Torii, Hamamatsu, Japan

[73] Assignee: Yamaha Corporation, Hamamatsu, Japan

[21] Appl. No.: 684,847

[22] Filed: Apr. 15, 1991

[30] Foreign Application Priority Data

Apr. 16, 1990 [JP] Japan .................. 2-99893

[51] Int. Cl.$^5$ .................. H03M 7/30; H04N 9/80
[52] U.S. Cl. .................. 341/61; 375/122
[58] Field of Search .................. 341/61, 122, 123; 364/724.01, 723; 375/122; 121

[56] References Cited

U.S. PATENT DOCUMENTS

| | | | |
|---|---|---|---|
| 4,109,110 | 8/1978 | Gingell | 341/61 |
| 4,281,318 | 7/1981 | Candy et al. | 341/61 |
| 4,460,890 | 7/1984 | Busby | 341/61 |
| 4,870,661 | 9/1989 | Yamada et al. | 341/61 X |
| 4,903,019 | 2/1990 | Ito | 341/61 |

*Primary Examiner*—Sharon D. Logan
*Attorney, Agent, or Firm*—Burns, Doane, Swecker & Mathis

[57] ABSTRACT

A conversion method converts a first digital signal having a first sampling period to a second digital signal having a second sampling period which is different from the first sampling period. The method comprises four steps. In the first step, the first digital signal is oversampled. In the next step, the sample value of the oversampled signal maintains an identical value during a short period corresponding to a common multiple of the first sampling period and the second sampling period. In the third step, an interpolation process is carried out. Finally, the second digital signal is outputted by sampling at the second sampling period.

4 Claims, 6 Drawing Sheets

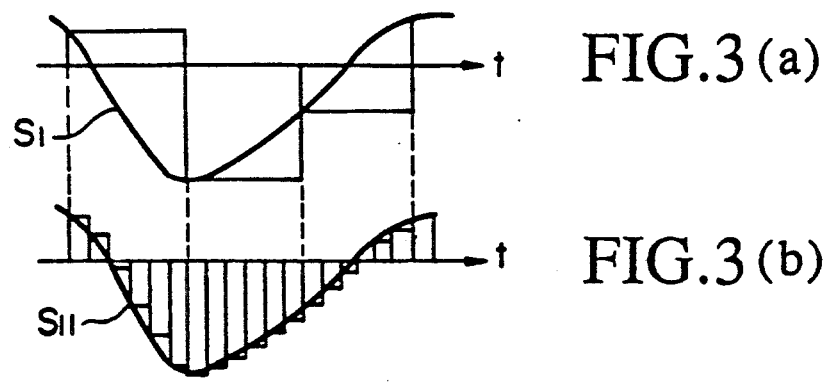
FIG.3 (a)
FIG.3 (b)
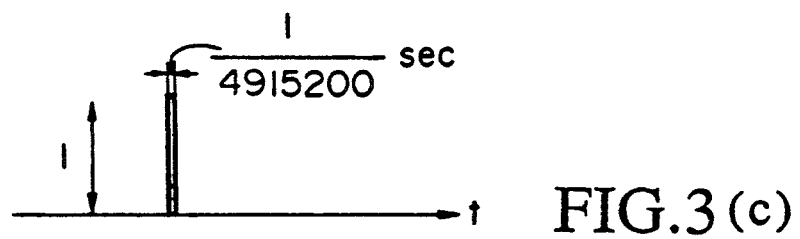
FIG.3 (c)
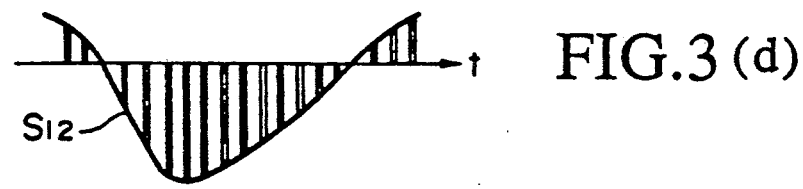
FIG.3 (d)
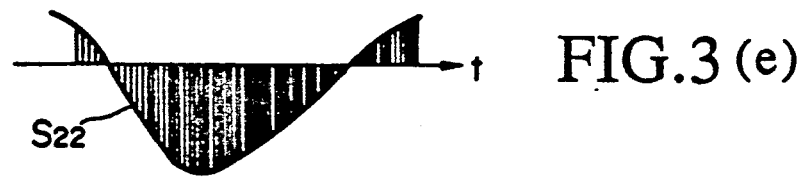
FIG.3 (e)
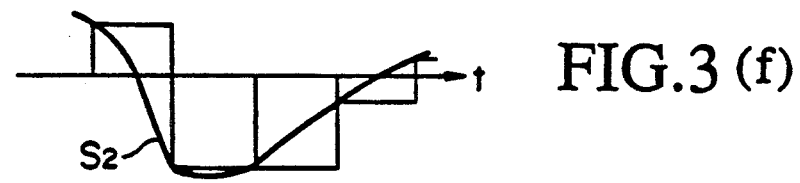
FIG.3 (f)

CLOCK $\phi_1$
($f_1=8KHz$).

CLOCK $\phi_{11}$
($k_1f_1=48KHz$)

CLOCK $\phi_{22}$
($k_2f_2=4.9152MHz$)

CLOCK $\phi_{12}$

METHOD FOR CONVERTING A DIGITAL SIGNAL INTO ANOTHER DIGITAL SIGNAL HAVING A DIFFERENT SAMPLING FREQUENCY

BACKGROUND OF THE INVENTION

1. Field of the Invention

The present invention relates to a method for the exchange in real time of digital signals between two digital systems having sampling timings which are asynchronous and have differing cycles.

2. Background Art

In communications using digital circuits represented by ISDN, the sampling of an analog signal and the clock synchronizations of data at the terminal side are conducted based on a timing signal supplied from the network side. This presents no problems with respect to a terminal having a system which was designed from the outset to use digital circuits; however, in the case in which a terminal using analog circuits is connected to digital circuits, this connection is usually accomplished through the medium of an analog signal. For example, in a GIII facsimile, which is defined by the CCITT recommendation T.4, the terminal in the inner digital signal processing part is connected to analog circuit terminals, to convert the digital signal to analog signals by a modem (see FIG. 1).

In the above technique, in the case in which the sampling cycle of a digital signal is changed, a method is used in which the digital signal which is to be processed is converted to an analog signal by a D/A (digital-/analog) converter, the high frequency signal contained in the analog signal is eliminated by an analog filter, and the analog signal obtained as a result undergoes sampling at a desired sampling cycle, and then is converted to a digital signal by an A/D (analog/digital) converter.

As in GIII facsimiles defined by the CCITT recommendation T.4, in the case in which a terminal in the interiors of which digital signal processing is conducted is connected to digital circuits, the connection thereof by digital signals has been considered.

However, at the time of the realization thereof, there is a problem in that the terminal and the network use mutually different sampling timings. The modem used in GIII facsimiles operates according to an individual sampling timing applicable to its signal processing and the cycle thereof is normally different from that of the timing signal supplied from the network.

Furthermore, in order that the modem of the GIII facsimile receive a simultaneous signal, it is necessary that the sampling timing be so set as to permit the control thereof by the modem.

In addition, the conventional conversion method for sampling cycles by an analog signal utilizes analog circuits such as D/A converters, analog filters, and A/D converters, and the like, so that the quality of the digital signal after conversion is affected by the variance in performance of these analog circuits. Furthermore, in order to use analog circuits in a digital system, it is necessary to take countermeasures so that the noise of the digital system will not enter the analog circuits, and for this reason, a very high degree of mounting technology is required.

SUMMARY OF THE INVENTION

The present invention was created in view of the above conditions; it is an object thereof to provide a method for the conversion of the sampling cycle of digital signals without the use of analog circuits. That is, it is an object of the present invention to provide a method for the exchange in real time of digital signals between two digital systems having asynchronous sampling timings with different cycles, and to provide a method which enables the control of these sampling timings.

A method is disclosed for converting an initial digital signal having an initial sampling frequency F1 to a final digital signal having a final sampling frequency F2, comprising the steps of: first sampling the initial digital signal having a predetermined sampling frequency by first sampling frequency to thereby convert the initial digital signal into a first digital signal having the first sampling frequency K1F1 of an integral multiple of the predetermined sampling frequency; extending a hold-period of sample values of the first digital signal by a predetermined period to form a second digital signal; second sampling the second digital signal by second sampling frequency to thereby generate a third digital signal, wherein the sampling frequency of the third digital signal K2F2 being sufficiently higher than the first sampling frequency and an integral multiple of the final sampling frequency; interpolating the third digital signal to thereby generate a fourth digital signal; and third sampling the fourth digital signal by the final sampling frequency F2 to thereby generate the final digital signal.

Furthermore, in the above, the timing at which the fourth digital signal undergoes sampling is controllable.

In accordance with the above invention, after a digital signal which is to undergo processing has undergone oversampling with respect to a second digital signal in which the equivalence maintenance period of each sample value has been extended, sampling is conducted in accordance with a sampling cycle K2F2 in which a fixed cycle F2 is multiplied by K2. In this case, the equivalence maintenance period of each sample is appropriately long so that sampling of a sample in which the sample value is not zero is reliably conducted. In this way, with respect to a third digital signal with sampling cycle K2F2, after interpolation processing is conducted, the signal undergoes decimation and is converted into a digital signal with a fixed sampling cycle.

By means of conducing the decimation after interpolation, the sampling timing at the time of decimation can be controlled.

BRIEF DESCRIPTION OF THE DRAWINGS

FIGS. 3(a)–3(f) are waveform diagrams showing digital signal taken from each processing stage of the preferred embodiments.

DETAILED DESCRIPTION OF THE PREFERRED EMBODIMENTS

Hereinbelow, preferred embodiments of the present invention will be explained with reference to the diagrams.

Figure 1:
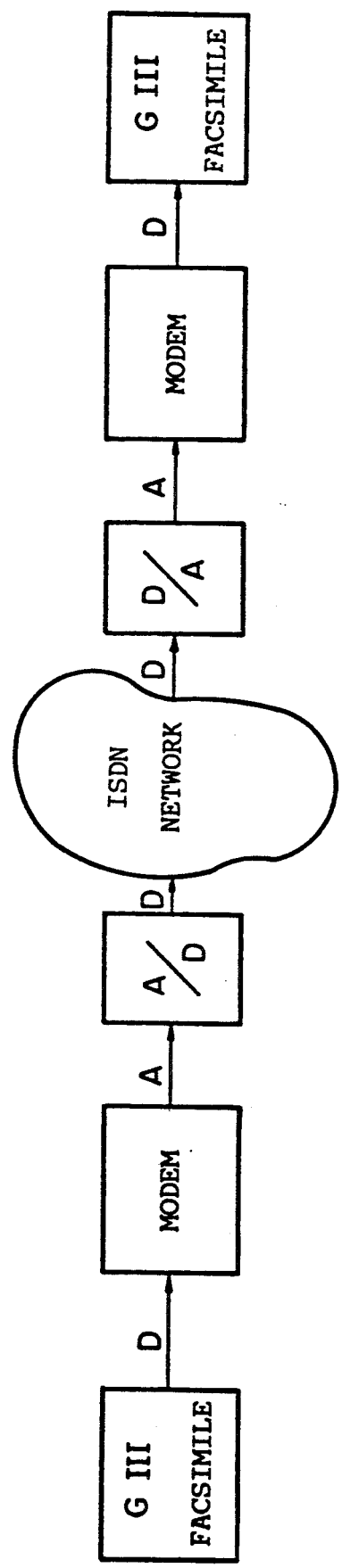
FIG. 1 is a diagram explaining a conventional digital-/analog conversion method in a communication system.
Figure 2:
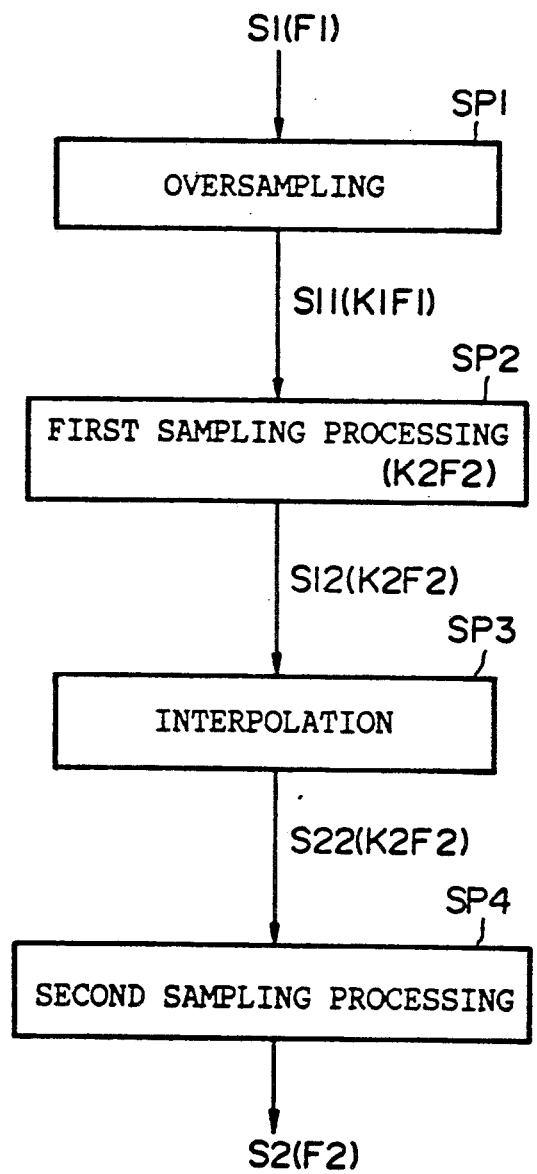
FIG. 2 is a flow chart explaining a conversion method for sampling cycles of digital signal in accordance with a preferred embodiment of the present invention.

FIG. 2 is a flow chart showing a conversion method for sampling cycles of digital signals in accordance with a preferred embodiment of the present invention. Digital signal S1 is a digital signal which is to be processed, and it is presumed that the sampling cycle F1 is supplied from the digital circuit side. Digital signal S2 is a desired digital signal and sampling cycle F2 is presumed to be supplied by the modem within a GIII facsimile.

The sampling timing of digital signal S11 is created by the gradual increase of the sampling timing of digital signal S1. The sampling timings of digital signals S12 and S22 are synchronous with the sampling timing of digital signal S2.

FIGS. 3(a)–(f) are waveform diagrams showing examples of the digital signals which are the objects of processing in each step of the process of the same preferred embodiments. In actuality, the samples in this digital signal processing are expressed as a series of impulses; however, in order to show the state of the sample holds caused by the digital delay elements, for purposes of convenience, they are expressed as a rectangular wave which has undergone a 0th hold. Hereinbelow, a case will be explained in which the digital signal S1 which is to undergo processing is an 8-bit PCM (pulse code modulation) signal with a sampling cycle F1=8 kHz, and this digital signal S1 is converted into a digital signal S2 with a sampling cycle F2=9.6 kHz. Furthermore, here, K1 is set equal to 6, while K2 is set equal to 512. The hardware used in the realization of the present embodiment comprises, as explained hereinafter, random logic circuits, which conduct signal processing, or DSP (digital signal processors).

First, the digital signal S1 shown in FIG. 3(a) is inputted into an oversampling filter, and as the output thereof, the digital signal S11 shown in FIG. 3(b) which has a sampling cycle K1F1=48 kHz is obtained (step SP1).

Figure 4:
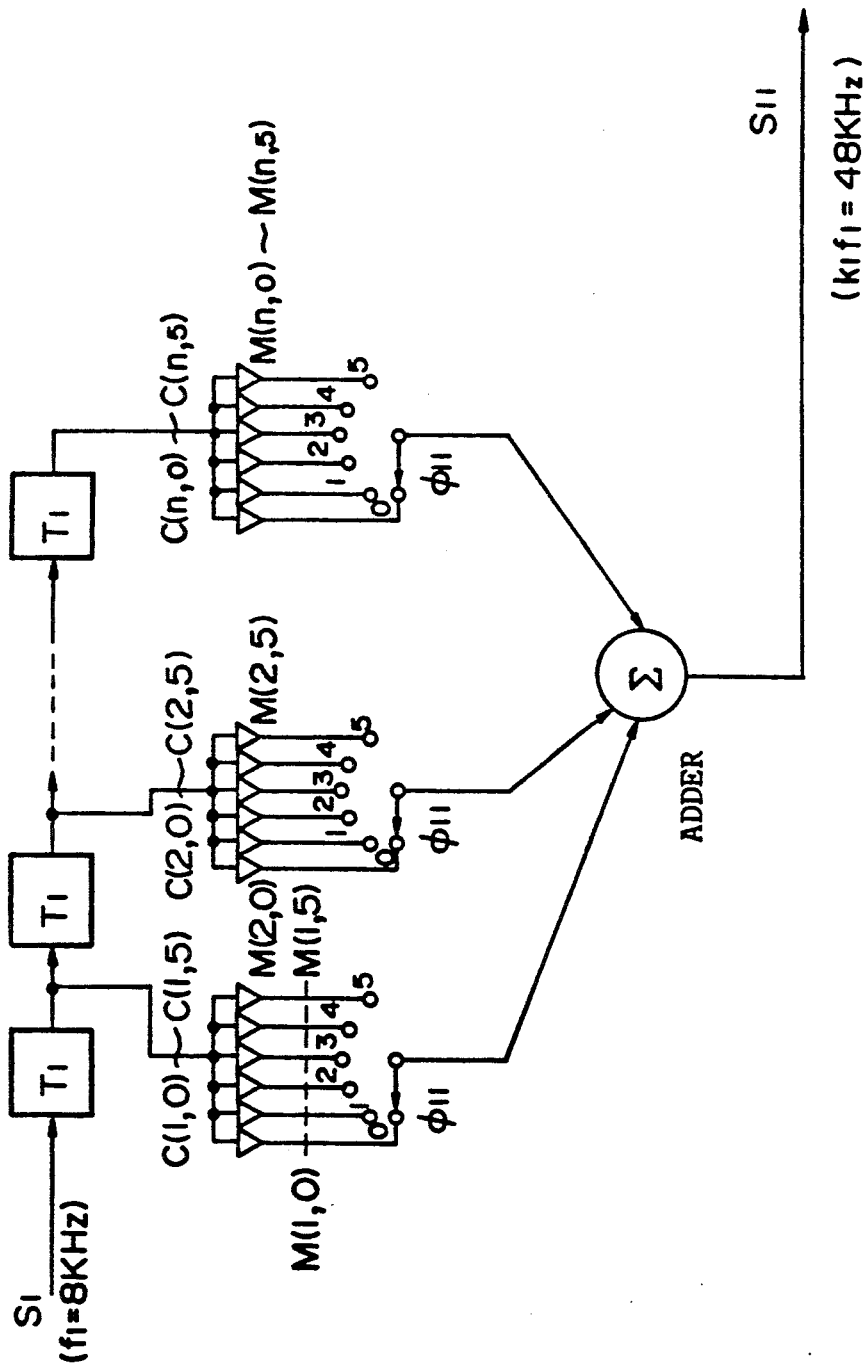
FIG. 4 is a signal flow diagram of an oversampling filter used in the same preferred embodiments.

In FIG. 4, an n-order six-time oversampling filter is shown which has as the input thereof the digital signal S1 shown in FIG. 3(a) and outputs the digital signal S11 shown in FIG. 3(b).

This filter comprises an amount N of delay elements T1, multipliers M(1,0) - M(1,5), ... M(N,0) - M(N,5), and an adder.

Here, a signal with a sampling cycle of 8 kHz is inputted into the delay element, and this is driven by a clock $\phi1$ which is synchronized with this signal.

Furthermore, six multipliers are provided at one stage of the delay element. Oversampling filter coefficients C(1,0) - C(0,5), ... C(N,0) - C(N,5) are supplied, in a time-divided fashion at K1F1 (48 kHz) corresponding to the output cycle, to multipliers M(1,0) - M(1,5), ... M(N,0) - M(N,5).

The adder adds the outputs of multipliers M(1,0) - M(1,5), ... and M(N,0) - M(N,5) and outputs a digital signal with a sampling cycle of 48 kHz.

Figure 5A:
FIGS. 5(a)–5(e) are timing diagram of the sampling clocks of these same preferred embodiments.
Figure 5B:
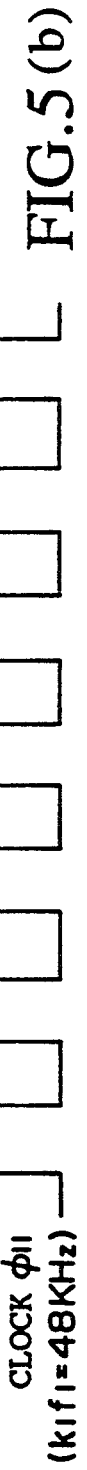
Figure 5C:
Figure 5D:
Figure 5E:
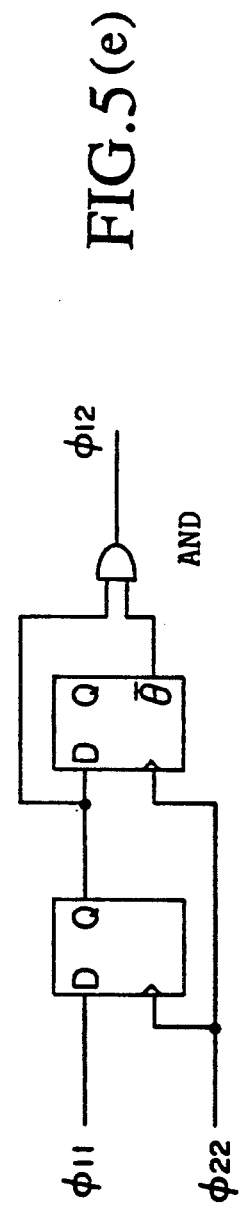

Next, digital signal S1 undergoes sampling by a sampling cycle K2F2=4.9152 MHz which has a cycle sufficiently higher than 48 kHz and in which the cycle thereof is 9.6 kHz×512, and thereby digital signal S12 is obtained. Concretely, as shown in FIG. 5, this processing is realized by means of the creation of a sampling signal $\phi12$ from sampling clocks $\phi11$ and $\phi22$. Here, FIG. 5(a) shows sampling clock $\phi1$ (8 kHz) of digital signal S1, and FIG. 5(b) shows sampling clock $\phi11$ (48 kHz) of digital signal S11; they are mutually synchronous. FIG. 5(c) indicates sampling clock $\phi22$ in which K2F2=4.9152 MHz; $\phi1$ and $\phi11$ are asynchronous. FIG. 5(d) indicates timing clock $\phi12$ of the digital signal S12 which is to be created; it is synchronous with sampling clock $\phi22$. FIG. 5(e) is a circuit diagram showing an example of a circuit which generates $\phi12$ from $\phi11$ and $\phi22$. In this circuit, during the period in which sampling clock $\phi11$ has a value of 1, digital signal S11 maintains the same sampling values; it is synchronized at the start up edge of sampling clock $\phi22$ by means of the sampling of sampling clock $\phi11$ itself, and then given a pulse amplitude corresponding to 1 cycle of $\phi22$. The digital signal S12 which is obtained as a result has a sampling clock $\phi22$ and the sampling values thereof are completely identical to those of the digital signal S11, however, conditions are appended thereto according to which the sampling values sampled by timing signal $\phi12$ at one time are effective.

This is explained according to signal processing theory as follows. First, signal S11 is not thought of as a rectangular wave as in FIG. 3(b), but rather as a series of impulses, and is inputted into a filter having the impulse response shown in FIG. 3(c). As a result, a signal is obtained as the filter output which has sample values identical to each sample of signal S11 and moreover in which each sample value continues for 1/4915200 second. After doing this, the signal of this filter output undergoes sampling in accordance with a sampling cycle K2F2=4.9152 MHz and the signal S12 shown in FIG. 3(d) is obtained. Herein, the reason for using a filter having impulse response such as that shown in FIG. 3(c) is so that the sample of S11 having effective values undergoes sampling only once (step SP2).

Next, interpolation is conducted by means of passing digital signal S12 through an interpolation filter; the high frequency component with a cycle of F2/2 or greater is eliminated from digital signal S12 and a digital signal S22 having a sampling cycle K2F2=4.9152 MHz is obtained. In the present preferred embodiment, by inputting the digital signal S11 at the time at which the sampling clock thereof is $\phi12$, into an interpolation filter, digital signal S22 is obtained. Here, in order to simplify calculations, a straight-line interpolation filter is used as the interpolation filter (step SP3).

Next, with respect to digital signal S22, sampling with one sample at each of 512 samples, in other words, interpolations, is conducted, and a digital signal S2 shown in FIG. 3(f) having a fixed sampling cycle F2=9.6 kHz is obtained (step SP4).

Figure 6:
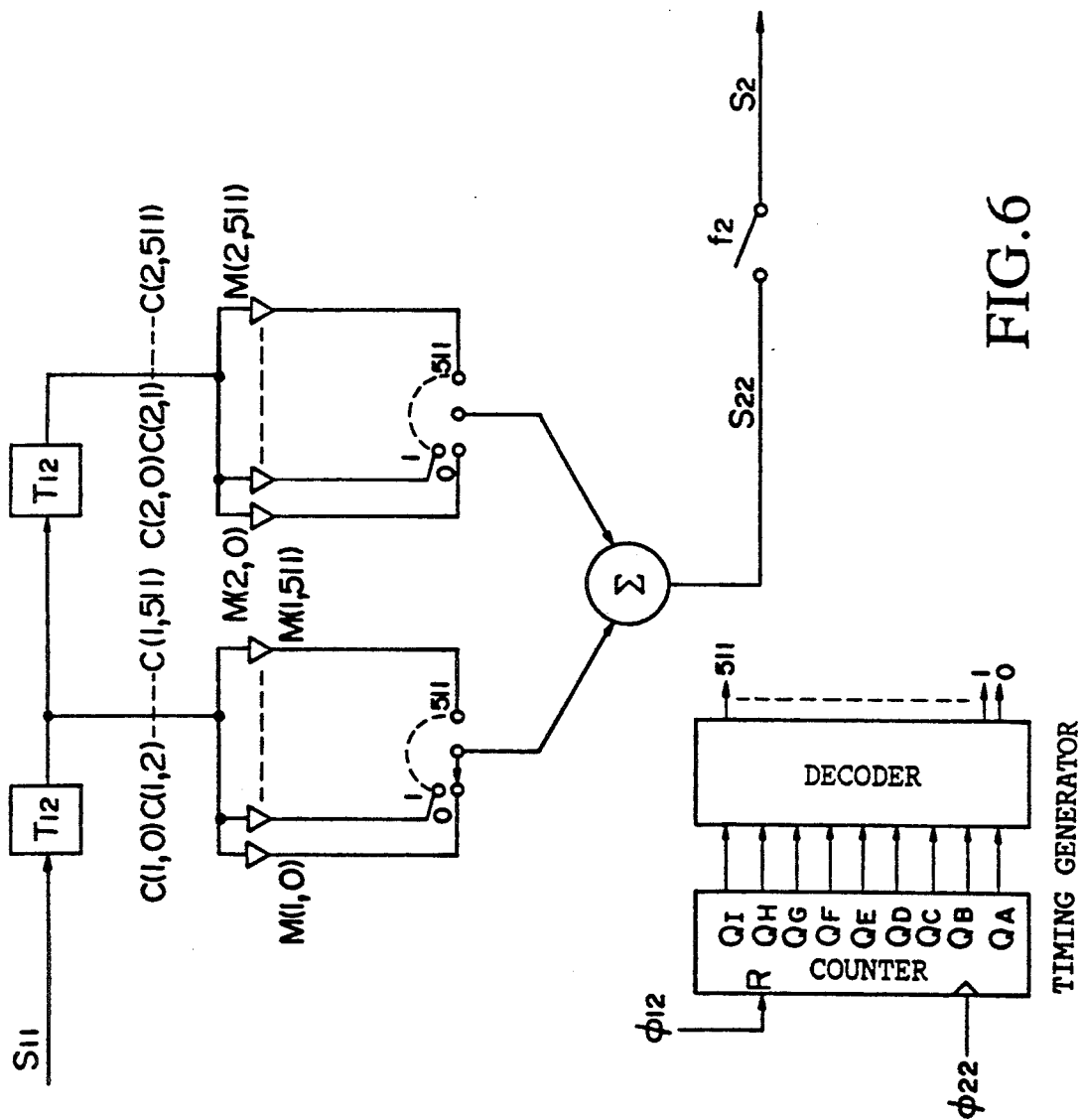
FIG. 6 is a signal flow diagram of an interpolation filter used in the same preferred embodiments.

In FIG. 6, an interpolation filter is shown which has digital signal S11 as the input thereof and outputs digital signal S22.

The interpolation filter comprises 2 delay elements T12, multipliers M(1,0), M(1,2), ... M(1,511), M(2,0), M(2,1), ... M(2,511), an adder, a timing generator, and a switch which fetches sample values.

Here, the reason that 2 delay elements are used is that in an interpolation filter relating to the present invention, as above, straight-line interpolation is carried out so that the interpolation points end at 2 points.

Filter coefficients C(1,0), C(1,2), C(1,511), C(2,0), ... C(2,511) which are used as interpolation coefficients in accordance with the output signal of the timing generator described hereinafter, are supplied to the multipliers in a time divided fashion.

The timing generator comprises a 9-bit counter and decoder. The counter is reset simultaneously with the start-up of clock $\phi 12$, and conducts count operations simultaneously with the start-up of $\phi 22$. The decoder outputs timing control signals from 0 to 511 in response to the output of the counter.

Multipliers M(1,0), M(1,2), ... M(1,511), M(2,0), M(2,1), M(2,511) operate in a time-divided fashion in accordance with the related timing control signals.

The adder adds the two outputs from the above multipliers and outputs an interpolation result.

Furthermore, the clock cycle used in the modem is provided to the switch. In the present preferred embodiment, the clock cycle F2=9.6 kHz so that sample values are outputted from this switch at a one-sample time division at each of 512 samples.

There is no need to conduct the sampling in step SP4 rigidly at each of 512 samples. The reason for this is that since interpolation is carried out in step SP3, if the sampling timing is synchronous with clock $\phi 22$, it is acceptable. Accordingly, it is possible to control sampling by means of the timing generated by the modem.

In the above preferred embodiments, K1=6, however, the case in which K1=1 is identical if the oversampling processing of step SP1 is omitted.

In the present preferred embodiments, K1=6, K2=512, F1=8 kHz, and F2=9.6 kHz, however, other coefficients and cycles would also be acceptable.

Furthermore, the industrial field of this method is not limited to the example of the connection of a GIII facsimile and a digital circuit as above.

As explained above, in accordance with the present invention, a digital signal to be processed, which has a sampling cycle F1, undergoes oversampling and is converted into a first digital signal having a sampling cycle K1F1 (K1 is an integer). By the fixed-period extension of the period in which sample values identical to those in each sample in the above first digital signal are maintained, a second digital signal is created. The above second digital signal undergoes sampling at a sampling cycle K2F2 which is sufficiently higher than cycle K1F1 and in which a fixed sampling cycle F2 is multiplied by K2 (K2 is an integer), and a third digital signal is thus created. Interpolation processing is carried out on this third digital signal, and a fourth digital signal is created. By sampling the fourth digital signal at a fixed sampling cycle F2, it is possible to change the sampling cycle of a digital signal without the use of analog circuits. Furthermore, by means of conducting decimation after interpolation, it is possible to control the sampling timing at the time of decimation.

Furthermore, as digital circuits can be connected without the necessity of conversion to analog signals, the analog circuits used for this purpose are not necessary and this has great merits from the standpoint of design.

What is claimed is:

1. A method for converting an initial digital signal having an initial sampling frequency to a final digital signal having a final sampling frequency, comprising the steps of:
    first sampling the initial digital signal having a predetermined sampling frequency by a first sampling frequency to thereby convert the initial digital signal into a first digital signal having the first sampling frequency of an integral multiple of the predetermined sampling frequency;
    extending a hold-period of sample values of the first digital signal by a predetermined period to form a second digital signal;
    second sampling the second digital signal by a second sampling frequency to thereby generate a third digital signal, said second sampling frequency being higher than the first sampling frequency and an integral multiple of the final sampling frequency;
    interpolating the third digital signal to thereby generate a fourth digital signal; and
    third sampling the fourth digital signal by the final sampling frequency to thereby generate the final digital signal.

2. A method for converting an initial digital signal having an initial sampling frequency to a final digital signal having a final sampling frequency according to claim 1,
    wherein said step of interpolating includes a step of: performing a straight-line interpolation.

3. A method for converting an initial digital signal having an initial sampling frequency to a final digital signal having a final sampling frequency according to claim 1, further comprising the step of:
    controlling sampling timing for the fourth digital signal.

4. Method for exchanging digital signals between two asynchronous digital systems comprising the steps of:
    sampling an input digital signal with a first predetermined sampling frequency to generate a first digital signal having a frequency which is a multiple of said predetermined sampling frequency;
    filtering each sampled value of said first digital signal with a first filter having an impulse response;
    sampling said filtered first digital signal with a second sampling frequency to generate a second digital signal, said second sampling frequency being higher than said first sampling frequency and being a multiple of a second predetermined sampling frequency;
    filtering said second digital signal with an interpolation filter to generate a third digital signal; and
    sampling said third digital signal with said second predetermined sampling frequency to generate an output digital signal.

* * * * *